United States Patent
Poetzinger

(10) Patent No.: US 8,964,404 B2
(45) Date of Patent: *Feb. 24, 2015

(54) ELASTIC UNIT FOR CLAMPING AN ELECTRONIC COMPONENT AND EXTENDING BELOW AN ELECTRONIC COMPONENT RECEIVING VOLUME OF AN ALIGN FIXTURE

(75) Inventor: Johann Poetzinger, Fischbachau (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 467 days.

This patent is subject to a terminal disclaimer.

(21) Appl. No.: 12/858,383

(22) Filed: Aug. 17, 2010

(65) Prior Publication Data
US 2011/0043982 A1     Feb. 24, 2011

Related U.S. Application Data

(60) Provisional application No. 61/234,754, filed on Aug. 18, 2009.

(51) Int. Cl.
*H05K 7/14* (2006.01)
*H05K 7/18* (2006.01)
(Continued)

(52) U.S. Cl.
CPC ............ *G01R 1/0425* (2013.01); *G01R 1/0466* (2013.01); *G01R 31/2893* (2013.01)
USPC ........... 361/802; 361/829; 206/701; 206/706; 206/714; 324/757.04

(58) Field of Classification Search
CPC ......... H05K 3/30; H05K 3/301; H05K 3/303; H05K 13/00; H05K 13/0084; B65D 25/005; B65D 73/02; B65D 85/00; G01R 1/0408; G01R 1/0425; H01L 21/67333

USPC ............ 174/537; 29/834; 438/107; 361/801, 361/802, 810, 813, 829; 439/73; 206/701, 206/725, 706, 714, 716, 718, 724; 324/757.01, 757.02, 757.03, 757.04

See application file for complete search history.

(56) References Cited

U.S. PATENT DOCUMENTS

| | | | |
|---|---|---|---|
| 4,427,249 A | | 1/1984 | Bright et al. |
| 4,718,548 A | * | 1/1988 | Estrada et al. ................ 206/724 |

(Continued)

FOREIGN PATENT DOCUMENTS

| | | |
|---|---|---|
| CN | 1841693 A | 10/2006 |
| EP | 0 844 655 A2 | 5/1998 |

(Continued)

OTHER PUBLICATIONS

Machine Translation of Hanaguruma (JP 11-195895) provided in Office Action.*

(Continued)

*Primary Examiner* — Chau N Nguyen
*Assistant Examiner* — Roshn Varghese
(74) *Attorney, Agent, or Firm* — Christie, Parker & Hale, LLP

(57) ABSTRACT

An align fixture for aligning an electronic component having a receptacle adapted to receive the electronic component and having a first abutting section and a second abutting section, the first abutting section being mounted via an elastic unit, the first abutting section and the second abutting section delimit an electronic component receiving volume in which the electronic component is to be received in the receptacle, the elastic unit extends below a bottom side of the electronic component receiving volume, and the elastic unit is adapted to provide a clamping force for clamping the electronic component between the first abutting section and the second abutting section.

12 Claims, 9 Drawing Sheets

(51) Int. Cl.
*H01R 9/00* (2006.01)
*B65D 85/00* (2006.01)
*G01R 31/20* (2006.01)
*G01R 1/04* (2006.01)
*G01R 31/28* (2006.01)

(56) References Cited

U.S. PATENT DOCUMENTS

| | | | |
|---|---|---|---|
| 4,855,866 A * | 8/1989 | Imamura et al. | 361/306.2 |
| 4,991,714 A * | 2/1991 | Clatanoff | 206/724 |
| 5,076,427 A * | 12/1991 | Thomson et al. | 206/714 |
| 5,176,255 A * | 1/1993 | Seidler | 206/724 |
| 5,215,472 A | 6/1993 | DelPrete et al. | |
| 5,307,929 A * | 5/1994 | Seidler | 257/676 |
| 5,375,710 A * | 12/1994 | Hayakawa et al. | 206/724 |
| 5,420,758 A * | 5/1995 | Liang | 361/813 |
| 5,476,174 A * | 12/1995 | Uratsuji | 206/722 |
| 5,494,169 A * | 2/1996 | Matsuoka | 206/724 |
| 5,596,229 A | 1/1997 | Simon | |
| 5,872,458 A | 2/1999 | Boardman et al. | |
| 5,878,890 A * | 3/1999 | Kaneko | 206/714 |
| 6,227,372 B1 * | 5/2001 | Thomas et al. | 206/725 |
| 6,268,740 B1 | 7/2001 | Iida | |
| 6,404,638 B1 * | 6/2002 | Messina | 174/16.3 |
| 7,129,726 B2 | 10/2006 | Tashiro et al. | |
| 7,156,680 B2 | 1/2007 | Saito | |
| 7,410,363 B1 | 8/2008 | Gattuso et al. | |
| 2003/0017629 A1 | 1/2003 | Tsui et al. | |
| 2006/0071656 A1 * | 4/2006 | Joung et al. | 324/158.1 |
| 2006/0154386 A1 | 7/2006 | Cheng et al. | |
| 2006/0220667 A1 | 10/2006 | Tashiro et al. | |
| 2006/0290369 A1 | 12/2006 | Yamashita et al. | |
| 2007/0285106 A1 | 12/2007 | Henry et al. | |

FOREIGN PATENT DOCUMENTS

| | | |
|---|---|---|
| EP | 2 209 376 A2 | 3/2011 |
| JP | 49-82967 | 8/1974 |
| JP | H04-096845 | 8/1992 |
| JP | 06-124981 | 5/1994 |
| JP | 09-040068 | 2/1997 |
| JP | 10-163237 | 6/1998 |
| JP | 10-284878 | 10/1998 |
| JP | 11-195895 | 7/1999 |
| JP | 2000-049210 | 2/2000 |
| JP | 2002-25732 | 1/2002 |
| JP | 2005-26499 | 1/2005 |
| JP | 2006-284384 | 10/2006 |
| JP | 2007-106799 | 4/2007 |
| WO | WO2004/106944 | 2/2004 |
| WO | WO 2009/100910 A1 | 8/2009 |

OTHER PUBLICATIONS

Definition of elastic by www.thefreedictionary.com Mar. 19, 2013.*
Definition of elastic by www.dictionary.reference.com Mar. 19, 2013.*
Disclosed Anonymously 32449, Airjaw Centering Device, printed description, 1 page.
European Search Report, dated Jul. 6, 2011 for European Patent Application No. 10171340.2, 3 pages.
KIPO Office Action dated Jan. 18, 2012 for Korean Application No. 10-2010-0080028, 5 pages.
English Translation of Japanese Office action dated Mar. 26, 2012 for Japanese Patent Application No. 2010-181844, date of mailing Apr. 3, 2012, 6 pages.
KIPO Notification of Ex Officio Provisional Refusal dated Oct. 28, 2011, for Korean Application No. 10-2010-0080027, 5 pages.
Japanese Office action dated Jul. 28, 2011, for Japanese Patent Application No. 2010-181846, date of mailing Aug. 2, 2011, with English Translation of same, 6 pages.
English Translation of Japanese Office action dated Apr. 18, 2012 for Japanese Patent Application No. 2010-181845, date of mailing Apr. 24, 2012, 2 pages.

* cited by examiner

ELASTIC UNIT FOR CLAMPING AN ELECTRONIC COMPONENT AND EXTENDING BELOW AN ELECTRONIC COMPONENT RECEIVING VOLUME OF AN ALIGN FIXTURE

CROSS-REFERENCE TO RELATED APPLICATION

This application claims the benefit of U.S. Provisional Patent Application No. 61/234,754, filed on Aug. 18, 2009 in the United States Patent and Trademark Office, the entire content of which is incorporated herein by reference.

FIELD OF THE INVENTION

The invention relates to an align fixture for aligning an electronic component. Moreover, the invention relates to a carrier.

Beyond this, the invention relates to a method of using the carrier.

BACKGROUND OF THE INVENTION

Integrated circuits are usually fabricated on semiconductor wafers. The integrated circuits have a variety of uses and can be found in versatile electric devices. Depending on the purposes they are made for the integrated circuits and other electronic components such as resistors, capacitances and inductances are packaged, marked and tested before being assembled. For example, MEMS (micro electro mechanical system) components are tested under given temperatures, pressure, angles of inclination and different types of accelerations. Hence, the complete manufacturing of electronic components can be divided into processes of pure fabrication and a process after finishing the contact patterns of the electronic components. There are three types of machine which handle electronic components the so called "Gravity handler" and "Pick & Place handler" handling singulated electronic components and the "Strip handler" which handle so called strips.

US 2003/0017629 A1 discloses an apparatus for supporting singulated electronic devices during a testing operation, comprising: a main body and a support member, wherein said support member is made of non-conducting high-resistivity material and comprises a plurality of recesses, each said recess being adapted to receive an individual singulated device. There is also disclosed a method for testing such devices in which the devices are carried on support members through a testing process including one or more environmental control chambers.

US 2006/0154386 A1 discloses an apparatus and method are provided for aligning a plurality of semiconductor devices placed on a carrier. Alignment guides are located adjacent to each device in use, and arranged such that they correspond to a desired alignment of each semiconductor device. For alignment, the semiconductor devices are held by a positioning device comprising a plurality of holders, each holder being configured to generate a force to hold a semiconductor device. Actuators are also provided that are operative to move the positioning device and holders to bias the semiconductor devices against the alignment guides to orientate the semiconductor devices until they are aligned with said alignment guides.

U.S. Pat. No. 7,156,680 B2 discloses an insert and electronic component handling apparatus provided with the same. To provide a guide core capable of being detachably attached to an insert body and an insert body to which the guide core can be detachably attached, U.S. Pat. No. 7,156,680 B2 provides a guide core able to be attached in a detachable way to an insert body, comprising a supporting portion capable of supporting an external terminal face of an area array type electronic component so that external terminals of the area array type electronic component are exposed to the direction of connection terminals of a socket, and a hook receiver able to be engaged in a releasable way with a hook portion provided to the insert body, and an insert body able to be attached in a detachable way with the guide core, comprising an electronic component guide portion comprising a guide core attachment socket to which the guide core is attached, and an electronic component inlet connected with the guide core attachment socket so that an electronic component can be guided to the guide core attached to the guide core attachment socket, and a hook portion able to be engaged in a releasable way with a hook receiver provided to the guide core.

U.S. Pat. No. 5,596,229 A discloses a chip carrier structure for containing a chip carrier having electrical contact pads having a positioning structure for the chip carrier and a slotted structure mated to form a mated structure containing said chip carrier, the slots of the slotted structure being in alignment with the pads of the chip carrier to provide electrical and mechanical access to the pads from the exterior to the interior of the mated positioning and slotted structures.

OBJECT AND SUMMARY OF THE INVENTION

There may be a need for a system capable of aligning an electronic component in an efficient way.

In order to achieve the object defined above, an align fixture for aligning an electronic component, a carrier comprising multiple align fixtures, and a method of using a carrier are provided.

According to an exemplary embodiment of the invention, an align fixture for aligning an electronic component is provided, wherein the align fixture comprises a receptacle (which may be denoted as a device to receive and contain something) adapted (particularly intended) to receive the electronic component and comprising a first abutting (particularly touching) section (particularly segment) and a second abutting section, the first abutting section being mounted (particularly mounted to a support plate or to a frame structure of the align fixture) via an elastic (particularly flexible, resilient or springy) unit (particularly a piece or complex of apparatus serving to perform one particular function), wherein the first abutting section and the second abutting section delimit an electronic component receiving volume (particularly a space in between serving for accommodating an electronic component) in which the electronic component is to be received in the receptacle, wherein the elastic unit extends (partially or completely) below a bottom side of the electronic component receiving volume; and wherein the elastic unit is adapted to provide a clamping force for clamping the electronic component between the first abutting section and the second abutting section.

According to another exemplary embodiment of the invention, a carrier for aligning multiple electronic components is provided, wherein the carrier comprises multiple align fixtures having the above mentioned features.

According to still another exemplary embodiment of the invention, a method of using a carrier having the above mentioned features is provided, wherein the method comprises:

actuating a clamping mechanism to expose openings in the receptacles being larger than the electronic components (particularly moulded parts) to be received;

positioning (particularly placing) the electronic components in the openings in the receptacles (particularly after exposing the openings);

actuating the clamping mechanism to reduce a size of the opening so that the electronic components are aligned within the receptacles of the carrier (particularly after positioning).

The term "align fixture" may particularly denote a device for supporting a physical structure during machining or handling. A "physical structure" may in this context particularly denote the material, piece of material or electronic component that is operated upon at any stage in the process of manufacture or handling.

The term "align" may particularly denote that something is ranged or lined up. E.g. an electronic component may be aligned with a fixed abutting section.

The term "electronic component" may particularly denote any component adapted for being mounted on an electronic support substrate such as a printed circuit board. Such electronic components may also be handled by a handling machine, the so called "handler". Examples for electronic components are electronic chips, i.e. packaged dies or naked unpackaged dies.

The term "receptacle" may particularly denote a device to receive and contain something or may more particularly denote a container for an electronic component.

The term "abutting section" may particularly denote a touching segment, i.e. a portion of a receptacle which directly abuts to an electronic component.

The term "the first abutting section and the second abutting section delimit an electronic component receiving volume in which the electronic component is to be received in the receptacle" may refer to a three-dimensional space section in between the first abutting section and the second abutting section. More particularly, the term "electronic receiving volume" may refer to a space in between the first abutting section, the second abutting section and a base support section of the receptacle. The electronic receiving volume may be the place where the electronic component may be situated in the receptacle.

The term "carrier" may particularly denote a container for carrying or a device that carries. A carrier may be a strip-like member adapted for carrying multiple electronic components in receptacles of the carrier. Such a carrier may be used in conjunction with a handler allowing to handle the electronic devices using the carrier for subsequently carrying out a test (such as a function test) of the electronic components.

The term "clamp" may particularly denote that the carrier is designed to have parts brought together for holding or compressing the electronic components. The parts which may be brought together may be the first abutting sections and the second abutting sections. The clamping may be elastically. The term "elastic" may particularly denote that a force may be exerted which is particularly flexible, resilient or springy such as a Hook force.

The term "elastic unit which extends below a bottom side of the electronic component receiving volume" may particularly denote that, in an operation state in which the electronic component is received in the electronic component receiving volume, the elastic unit is covered partly or entirely by the electronic component in a plan view on the align fixture from above. This does not rule out that a part of the elastic unit is aligned at the same height or even above of the electronic component receiving volume.

In an embodiment, the first abutting section, the second abutting section, and the base support section may delimit an electronic component receiving volume in which the electronic component may be received, wherein at least a part of the elastic unit may extend below a bottom side of the electronic component receiving volume. By arranging the elastic unit below an electronic component receiving volume the space needed for the align fixture may be kept small. For electronic components being larger than the average electronic components it may be helpful to save space in the main plane of the align fixture. Since the deflection of the elastic unit may be larger for big sized electronic components it follows that significant (for instance up to eight times) of the space may be saved by arranging the elastic unit below the electronic component receiving volume compared to an arrangement in which the elastic unit is arranged exclusively beside the electronic component receiving volume. Using a flat spring (such as a meandrically shaped spring or a leaf spring) as the elastic unit, a basically planar structure may be obtained which allows to form an align fixture in a very compact way.

In an embodiment, a carrier may be provided for aligning multiple components, wherein the carrier comprises multiple align fixtures. The multiple align fixtures may be arranged in a matrix form (i.e. in rows and columns) and may be fixedly mounted together to form the carrier. The carrier may have similar properties like the single align fixture but may be applicable on multiple electronic components, i.e. may carry multiple electronic components at the same time, particularly in an integrally formed way. The electronic components may be aligned in defined manner in the receptacles by the align fixtures of the carrier. Thus, the carrier is adapted to allow for aligning multiple electronic components.

According to an exemplary embodiment of the invention, a method of using the carrier may be provided, wherein the electronic components may be placed in temporarily enlarged receptacles of the carrier and thereupon may be elastically clamped and aligned by a clamping mechanism in a reduced size of the receptacles. The transition of the enlarged size of the receptacles to a clamping size of the receptacles may take place in a self-acting manner.

In the following, further exemplary embodiments of the align fixture will be described. However, these embodiments also apply to the carrier and to the method.

The align fixture may comprise an actuatable structure formed at the first abutting section, wherein the actuatable structure may be actuable by a corresponding actuation structure (of a handler device or the like) for manipulating the receptacle. The actuatable structure may be for instance a recess, a protrusion, etc. which can be actuated by any appropriate force application mechanism (for instance applying a mechanical force, an electric force, a magnetic force, etc.) controlled by the actuation structure. The actuation structure may be configured (for instance shaped and/or dimensioned) correspondingly to the actuatable structure and may be for instance a protrusion or any other force application element which can actuate the actuatable structure using any appropriate force application mechanism (for instance applying a mechanical force, an electric force, a magnetic force, etc.) for controlling the receptacle in a desired way (for instance for temporarily enlarging or reducing an opening thereof).

An actuatable structure (particularly an actuatable hole, an actuatable pin or an actuatable arm) may be adapted to be actuated to, in turn, actuate the elastic unit. The actuatable structure may be located besides the receptacle (particularly beside a boundary area of the receptacle). The actuatable structuure and the first abutting section may form a stiff member. The actuatable structure may be accessible (by an actuation element controlled by a controller of a handler) from a side from which the electronic component is to be received.

The elastic unit (particularly one or two spring elements) may extend from one corner region of the receptacle to another corner region of the receptacle. In an embodiment the elastic unit may extend from the first abutting section to the second abutting section. Two spring elements may extend aside to each other forming the elastic unit. At least one spring element may be planar. At least one spring element may be meandrical. Both spring elements may be meandrical and may extend beside each other in a mirror-symmetrical form according to a diagonal from a corner region of the first abutting section to the second abutting section. The spring elements may form at least partially a part of a support for the electronic component. The height of the cross-section of the spring elements may be greater than the width of the cross section of the spring elements. With one of its end the spring element may be fixedly mounted to the first abutting section and with the other one of its end the spring element may be fixedly mounted to the second abutting section. The spring element and the base support plate may be integrally formed from one plate.

The first abutting section may extend upwardly or may protrude vertically from the elastic unit to which it is mounted, and the first abutting section may extend aside (particularly beside) of the electronic component receiving volume. The first abutting section being flexibly mounted may extend aside of the electronic receiving volume and in the same height of the electronic receiving volume in order to be adapted to abut on the electronic component to be received. The first abutting section may extend from the elastic unit extending below the electronic receiving section upwardly to and aside of the electronic receiving section, and the flexibly mounted abutting section may be adapted to abut on an electronic component received in the receptacle. The first abutting section may be L-shaped and may engage a corner region of the electronic component. The first abutting section and the second abutting section may be adapted to clamp the electronic component in a space between them.

An actuation element (particularly an actuation hole, an actuation pin or an actuation arm) may be adapted to actuate the elastic unit. The actuation element may be located beside the receptacle (particularly beside a boundary area of the receptacle). The actuation element and the first abutting section may form a stiff member. The actuation element may be accessible from a side from which the electronic component is to be received.

The first abutting section may be adapted to exert a first force and the second abutting section may be adapted to exert a second force on the electronic component, wherein the first force and the second force may be at least partially opposed (particularly are exerted against one another, i.e. antiparallel) to one another. The electronic component may be aligned in the receptacle of the align fixture. The first abutting section and the second abutting section abut on side sections of the electronic component. According to the exerted forces, the electronic component may rest and be aligned if the forces exerted on the electronic component are at least not directed in one direction. The electronic component may rest, by including frictional forces, when the two forces exerted on the electronic component by the first abutting section and the second abutting section are at least partially opposed.

The first abutting section and the second abutting section may be adapted so that the first force is exerted in a main plane of the receptacle (i.e. a force vector may lie within the main plane) and the second force is exerted parallel to this main plane of the receptacle. The main plane of the receptacle may be defined by being parallel to a main plain of the align fixture. The electronic component may be aligned in an appropriate way if the forces exerted by the first abutting section and the second abutting section are exerted in one plane. The first abutting section and the second abutting section may abut on side sections of the electronic component. By exerting both the first force and the second force in a main plane of the receptacle the total force on the electronic component shows no turning moment having the tendency to flip the electronic component out of the receptacle. The electronic component may be firmly aligned in the receptacle by forces being parallel to the main plane of the receptacle.

The receptacle may further comprise a base support section which forms a support surface (particularly something to hold up in position by serving as a foundation) parallel to a main plane of the receptacle. Planar base support section may also delimit (and define a bottom of) the electronic component receiving volume. The support force exerted by the base support section may act on a main plane of the electronic component, particularly may be antiparallel to the gravitational force. The electronic component may be arranged in the receptacle so that the main plane of the receptacle and the main plane of the electronic component are parallel. The base support section acting on the electronic component may be parallel to a main plane of the receptacle so that the electronic component is aligned by the support of the base support section in the main plane of the receptacle. An advantage of supporting the electronic component in the main plane of the electronic component may be that the load on the electronic component may be dispersed on different parts of the main surfaces of the electronic component and that the first force and the second force of the first and the second abutting sections may be exerted parallel to the base support section. Thus, the orientation of the first force and the orientation of the second force may avoid cracking of the electronic component on the base support section.

The base support section may be adapted to exert a (particularly vertical) support force perpendicular to the first force and to the second force. The support force exerted by the base support section may be adapted to align the electronic component rectangular to its main plane. The technical advantage of the support force being perpendicular to the forces exerted by the first and second abutting sections may be that there is no turning moment being exerted on the electronic component. Hence, the electronic component may remain in an aligned position relative to its main plane.

One or both of the first abutting section and the second abutting section may be flexibly mounted. A flexibly mounted abutting section may be adapted to perform a movement parallel to a main plane of the receptacle. The force exerted by the abutting section which is flexibly mounted is exerted parallel to a main plane of the receptacle. The force to align the electronic component may be provided by the elastic unit and the elastic unit may move the flexibly mounted abutting section and the electronic component in a main plane of the receptacle by the self-acting movement of the elastic unit in a main plane of the receptacle itself. Thus, the forces of the elastic unit may be exerted on the electronic component in a plane in which the electronic component is predominantly rugged or stable.

In particular, the flexibly mounted first abutting section is adapted to perform a movement parallel to a main plane of the receptacle.

The align fixture may comprise a base support plate above which the elastic unit is arranged, wherein the elastic unit may be adapted to perform a movement parallel to a main plane of the receptacle at least partially supported by the base support plate. In one embodiment, the base support plate and the elastic unit may be arranged parallel to a main plane of the receptacle and parallel to a main plane of the complete align fixture. The elastic unit may move along the base support plate on which the elastic unit may be arranged. At least in one direction (which may be the direction oriented towards the base support plate) the elastic unit may be secured against unwanted deformation. The base support plate may be planar or may have one or more recesses adapted to guide the movement of the elastic unit.

In particular, the align fixture comprises a base support plate arranged below the elastic unit, wherein the elastic unit is adapted to perform a movement parallel to a main plane of the receptacle at least partially supported by the base support plate.

The align fixture may comprise a base support plate and a receiving plate between which the elastic unit is arranged. The elastic unit may be adapted to perform a movement parallel to a main plane of the receptacle at least partially guided (particularly directing the motion of something) by the base support plate and the receiving plate. The receiving plate may particularly have a recess (or a receiving opening) via which the electronic component is receivable in the receptacle by insertion through the recess. In one embodiment, the base support plate, the receiving plate and the elastic unit may be arranged parallel to a main plane of the receptacle and parallel to a main plane of the complete align fixture. The elastic unit may move between the base support plate and the receiving plate between which the elastic unit may be arranged. The elastic unit may be secured against deformation in two directions. The two directions against which the elastic unit may be secured may be the direction oriented towards the base support plate and the direction oriented towards the receiving plate. The base support plate and the receiving plate may be planar or may have recesses adapted to guide the movement of the elastic unit.

The align fixture may further comprise at least one distance adjusting plate adapted for adjusting a thickness of the align fixture, for instance to adapt the align fixture for cooperation with a handler device with which it may be used. For distance adaption purposes the align fixture may comprise even more than three plates.

In particular, the align fixture comprises at least one thickness adjusting plate adapted for adjusting a thickness of the align fixture.

The elastic unit may comprise a spring element (particularly a rubber member, any kind of elastic material member, a spring formed from a steel spring plate, a spring formed from a spring wire or any kind of springs such as flat springs, coil springs, leaf springs, etc.). A planar spring, for instance a meander spring, may be preferred to optimize compactness. The spring element may be integrally formed from a plate. The spring element may show similar properties compared to the elastic unit wherein the elastic unit may be formed from several parts. The spring element may show elastic restore forces against deformation, i.e. a Hook behaviour.

The elastic unit may comprise a first spring element and a second spring element, wherein the one of the first abutting section and the second abutting section being flexibly mounted may be connected with both the first spring element and the second spring element. In one embodiment the first spring element and the second spring element are angularly arranged relative to one another. In one embodiment the first spring element and the second spring element are arranged parallel to one another. In another embodiment, the first spring element and the second spring element may be arranged relative to one another in an axially symmetric way or in a mirror symmetric way. Depending on the form, material and size of the spring element it may be advantageous to combine two spring elements to an elastic unit. Even more than two spring elements may form an elastic unit. By combining two or more spring elements to an elastic unit the direction and absolute value of the force exerted by the elastic unit may be adapted.

The elastic unit may be a separate elastic member adapted to be mounted at an elastic unit receiving section, in particular a receiving section of the align fixture. The elastic unit receiving section may be formed from one of the plates and may be adapted to receive a separate elastic member. To enhance the adaptivity of the align fixture the elastic unit may be a separate elastic member. One elastic unit plate or any other adapted plate may be suitable to receive different types of elastic members. As a consequence of this, a smaller number of plates may be sufficient to adapt the align fixture to different sizes of electronic components. It may be possible just to change the respective size of the receptacle, the position of the elastic unit receiving section or to change the size of the elastic members to be inserted for adapting the align fixture to different electronic component types. The separate elastic member may be detachably mounted by making it more convenient to change the align fixture.

The elastic unit receiving section may be adapted to fix the elastic unit at a suspension (particularly fastening or fixing) of the elastic unit so that the second elastic unit is fixed against rotation. Otherwise the elastic member may fail in exerting a force in a defined direction. The direction and the value of the force does not vary if the elastic unit is not rotatable. Because of the trend for miniaturization in semiconductor fabrication leading to smaller sizes of semiconductor devices it may be important to align the semiconductor devices very accurately. Thus, it is advantageous to prevent the elastic member received in its suspension against rotation because the forces may be defined in direction and value.

The elastic unit may be fixedly installed at or in the elastic unit receiving section in a form locking manner. The elastic unit receiving section may be adapted to fix the elastic unit in the suspension of the elastic unit wherein the elastic unit is fixedly installed with positive locking. Slipping of the separate elastic member may be prevented by fixedly installing the elastic unit in a form locking manner. The elastic unit may be prevented from falling out of the align fixture. By installing the elastic unit in a form locking manner the direction and the value of the force exerted by the elastic unit may be defined and may be maintained stable.

The first abutting section and the second abutting section may each form a stiff (particularly inelastic, inflexible, rigid, unbending or unflexible) member (particularly part) and may be adapted to engage (particularly come into contact with) the electronic component. The elastic unit may be adapted to exert (particularly apply) two force components on one of the first abutting section and the second abutting section, the force components being angled relatively to one another (particularly enclosing an angle which is, beyond tolerances, different from zero). The term "the elastic unit is adapted to exert two angled force components" may particularly denote that a force may be split into two rectangular force components acting on a surface. A skew force exerted by the elastic unit may act on at least one of the first and second abutting sections to apply on the at least one of the abutting sections two force components which are angled to each other. Two angled force components may be caused by a skew force exerted by the elastic unit. "Skew" force in this context may denote that a force is not parallel to a surface, i.e. the first and second abutting sections, but includes an angle to the surface which angle deviates from being parallel at least in an angle of 0.5°, 1°, 2°, 4°, 8° or 16°. The angle may be larger than 10°, particularly larger than 30°, more particularly larger than 45°. The skew force may be denoted as being angular. In one embodiment, the force may be directed on at least one rectangular abutting section in an angle of 45° relative to an internal angle of a rectangular abutting section. The skew force may be expressed by a force being exerted diagonally. According to an exemplary embodiment of the invention, an align fixture may be provided which aligns an electronic component in a self-acting manner in a receptacle. A skew force, e.g. a diagonally acting force (which respect to a for instance rectangular electronic device), may exert two angled force components on at least one of the first abutting section and the second abutting section. The force which may be skew or angular may be transmitted from the abutting section (being flexibly mounted on the elastic unit) via the electronic component to the abutting section being fixedly mounted. In an embodiment, the skew force may act in a non-parallel direction to each of the side sections of the electronic component. By providing two angled force components exerted by an elastic unit, the electronic component may be fully aligned by the first abutting section and the second abutting section without the need of further lateral abutment of the electronic component within the receptacle. This may be advantageous because only one elastic unit and two abutting portions may be sufficient for aligning the electronic component. The process of designing and manufacturing of the align fixture may be cost effective. When the electronic component is engaged by two angled side sections of one of the abutting sections, the alignment of the electronic component may be reliable due to the fact that only one elastic unit is used. An orientation of one elastic unit may define the direction of the skew force and the direction and value of the two angled force components. The skew force may be skew or angular relative to the side sections of the electronic component. The directions of the first abutting section and the second abutting sections may be defined to be parallel to the orientation of the side sections of the electronic component, respectively.

At least one of the first abutting section and the second abutting section may be adapted to engage two angled side sections of the electronic component in a form locking (particularly fastening) manner. The electronic component may be a semiconductor component and may have a basically cuboid shape with six different surfaces. The two opposing main surfaces, the so called symbol side and the parallel contact side, may denote a main plane of the semiconductor component since it is usually the symbol side and the contact side having a greater area than the remaining four side sections of the semiconductor component. Thus, the height of the electronic component defined by the height of the side sections of the electronic component may be smaller than a length of the both sides of the main surfaces.

Particularly three arrangements may be applied: First, the electronic component may abut with one part of one first of its side sections and may abut with one further part of a second of its side section on the abutting section being mounted via the elastic unit in a form locking manner. With a remaining one of its side sections or a corner region the electronic component may abut on the abutting section being fixedly mounted. The electronic component may be aligned to the fixedly mounted abutting section with one side section. Second, the electronic component may abut with one part of one first of its side sections or a corner region on the abutting section being mounted via the elastic unit. With two angled and remaining of its side sections the electronic component may abut on the abutting section being fixedly mounted in a form locking manner. The electronic component may be aligned to the fixedly mounted abutting section with two side sections. Third, the electronic component may abut with one part of one first of its side sections and may abut with one further part of a second of its side section on the abutting section being mounted via the elastic unit. With one third and a remaining fourth of its side sections the electronic component may abut on the fixedly mounted abutting section. The electronic component may be aligned to the fixedly abutting section with two side sections. According to the described first, second and third embodiment the position of the electronic component in its main plane may be fully defined.

The align fixture may comprise a further elastic unit via which a third abutting section is mounted and wherein the first abutting section and the third abutting section may be adapted to exert together two angled force components on the second abutting section. The third abutting section may be mounted to the further elastic unit and the first abutting section may still be mounted to the first elastic unit. The electronic component may be aligned by the first abutting section and the third abutting section towards the second abutting section. The elastic unit and the further elastic unit may exert forces wherein the forces are angularly to each other.

The first abutting section and the third abutting section may be adapted to engage at least two angled side sections of the electronic component. By engaging at least two angled side sections the electronic component may be completely aligned towards the second abutting section. Two abutting sections may be adapted to align the electronic component in two dimensions according to the two free dimensions of the electronic component. In an embodiment, the electronic component may be mounted to only move in a plane parallel to the main plain of the receptacle.

The align fixture may further comprise a frame, particularly a slidably mounted frame, wherein the first abutting section and/or the second abutting section and the elastic unit may be mounted on the slidably mounted frame (which may slide relative to a support plate or the like of the align fixture). As an alternative to a slidably mounted frame, a spatially fixed frame may be implemented (which may be rigidly fixed to or may form part of a support plate or the like of the align fixture). Such a frame may be for instance a rectangular structure formed by for instance four bars or rods. The first abutting section and the elastic unit may be mounted within an area delimited by the bars or rods. In one embodiment also the further elastic unit may be mounted at the floating receptacle frame. The frame, in turn, may or may not be mounted fixedly or flexibly on an outer support structure such as a plate. In one embodiment, a slidably mounted frame may comprise adjustment units to allow fine adjusting of the aligning performance of the receptacle. The first and second abutting sections may engage the electronic component and may align the electronic component with the first abutting section parallel to a main plane of the receptacle. Furthermore, the first abutting section and the elastic unit on which the second abutting section is mounted may both be mounted on a frame being slidably mounted in the main plane of the receptacle. By providing the slidably mounted frame with adjustment units it may be possible to allow fine adjustment of the receptacle and the electronic component received therein in the align fixture. The slidably mounted frame may be elastically mounted via at least one further elastic unit.

At least one of the group consisting of the first abutting section, the second abutting section, the elastic unit, the further elastic unit, the base support section and the (for instance slidably mounted) frame may be at least partially integrally formed from a plate. It may be convenient to manufacture at least one functional element from a plate by using design techniques such as etching techniques or laser techniques. These techniques may be optimally suitable for applying them on thin plates, for instance metal plates. By etching or laser cutting, a high accuracy for the structures being manufactured may be achieved.

At least two of the group consisting of the first abutting section, the second abutting section, the elastic unit, the base support section and the (for instance slidably mounted) frame may be at least partially integrally formed from one plate. The same advantages cited for integrally forming at least one of the functional elements from one plate hold for forming two ore even more functional elements from one plate. It may be even more convenient to manufacture as many functional elements as possible using one plate. Particularly the abutting section being mounted on the elastic unit and the elastic unit may be formed from one plate. Additionally, the first abutting section may be integrally formed from one plate. Even additionally the slidably mounted frame and the at least one further elastic unit may be manufactured integrally from one plate. Thus, the first abutting section, the second abutting section, the elastic unit, the slidably mounted frame and the at least the one further elastic unit or the third abutting section may be integrally formed from one plate. When properly adapting the form of the plate it may be even possible to form also the base support section from the same plate.

In the following, further exemplary embodiments of the carrier will be described. However, these embodiments also apply to the align fixture and to the method.

The carrier for aligning multiple electronic components may be provided with multiple align fixtures. In an embodiment, the multiple align fixtures may be integrally formed based on a common substrate (which may be constituted by one or more plates).

At least one elastic unit may be assigned to each of the receptacles. There may be one or more elastic units assigned to one receptacle. By assigning at least one elastic unit to one receptacle there may be a way to align one electronic component independently from another electronic component. This may be advantageous since receiving and aligning one first electronic component does not have an impact on receiving and aligning another second electronic component.

In particular, each of the receptacles has at least one assigned elastic unit.

At least one elastic unit may be assigned to multiple of the receptacles. The elastic unit may comprise more than one elastic sections and may be arranged in that two abutting sections are mounted on opposite sides of one elastic section. Even three, four, five or more receptacles may share one elastic unit. Moreover, is may be cost-efficient and space-saving to provide one elastic unit with more than one elastic section. It may be appropriate to provide an elastic unit plate with as many elastic units and elastic sections, respectively, as there are receptacles or electronic components, respectively.

The carrier may be provided with a first plate comprising the elastic units and a second plate comprising the second abutting sections, wherein the first plate is arranged slidably with respect to the second plate and wherein the first plate is adapted to allow for a mutual relocation of the multiple first abutting sections relative to the second abutting sections. According to an exemplary embodiment of the invention, the carrier may comprise multiple receptacles each receiving an assigned one of the multiple electronic components. The size of the multiple receptacles may be delimited by the first abutting sections of the first plate and the second abutting sections of the second plate. The first abutting sections of the first plate and the second abutting sections of the second plate may lie on opposed sides of the receptacles. The first plate and the second plate may be movable relative to each other along main planes of the first plate and of the second plate and the size of the receptacles may change when the relative position of the first plate and the second plate are changed relative to each other. The first plate and of the second plate may lie parallel to one another. The position of the first plate and of the second plate may be changed diagonally, i.e. a corner region of the first plate and a corner region of the second plate may be approached and contrary to this pulled apart. The movement of the first plate and of the second plate or an approach or pulling apart of the first abutting sections and the second abutting sections may take place in the main planes of the first plate and the second plate. The multiple electronic components may be clamped between the multiple first abutting sections and the multiple second abutting sections in the multiple receptacles when the corner regions of the first plate and the second plate approach. Corner regions of the receptacles may approach and pulled apart simultaneously when the corner regions of the first plate and the second plate approach and are pulled apart.

The first plate may be an elastic unit plate comprising a plurality of elastic units, wherein each of the receptacles has assigned at least one of the plurality of the elastic units. The first abutting sections may be each formed on an elastic unit respectively. The purpose of the elastic unit may be that compensatory tolerances for varying dimensions of the multiple electronic components may be permitted. Otherwise due to the varying dimensions of the electronic components the electronic components may fall out of the receptacles or misalignment may be caused. The elastic units may be particularly elastic coatings or rubber parts allowing for adjusting elastic properties of the first abutting sections. The elastic unit may also be any unit being elastic, such as any kind of springs. In an embodiment first plate and the second plate may be arranged parallel to each other. The first plate may move along the second plate on which the first plate may be arranged. At least in one direction which may be the direction towards the second plate the first plate may be secured against unwanted deformation. The second plate may be planar or may have recesses adapted to guide the movement of the first plate.

A position or a deformation state of each of the elastic units may determine one of the boundaries of the respective assigned receptacles. The position of the elastic units may determine the dimensions of the receptacles and the deformation state of the elastic units may determine the dimensions of the receptacles. The position of the elastic units may mutually change with the position of the first plate and the second plate relative to each other. The position of each first abutting section may change relative to each second abutting section. The change of the position of the first plate and the second plate relative to each other may cause a mutual change of the dimensions of each receptacle in the same manner, i.e. the dimensions of the receptacles may increase or the dimensions of the receptacles may decrease mutually. However, each receptacle may change its dimensions individually with a change of the deformation state of the elastic unit, respectively. The deformation state of the elastic unit and the dimension of the receptacle may increase when the elastic unit is brought into a prestressed position and may decrease when tension is relieved.

The first plate and the second plate may be elastically coupled to each other by at least one plate connecting elastic unit. It may be advantageous to couple the first plate and the second plate elastically by at least one plate connecting elastic unit. The at least one plate connecting elastic unit may be under tension when the dimensions of the receptacles are mutually increased and the tension of the plate connecting elastic unit may be relieved at least partially when the first plate and the second plate change their positions to decreased dimensions of the receptacles. The dimensions of the receptacles may be mutually decreased when the tension of the at least one plate connecting elastic unit is relieved in a self-acting manner.

The second plate may comprise a first plate abutting section adapted for abutment of the first plate. The first plate may comprise a second plate abutting section adapted for abutment of the second plate. The second plate abutting section and the first plate abutting section may define a clamping size of the receptacles when the first plate abutting section and the second plate abutting section abut on each other, wherein the clamping size of the receptacles may be adapted for a clamping of the electronic components in the respective receptacles. A clamping size of the receptacles, wherein each receptacle may be adapted to clamp a respective electronic component, may be provided by a position of the first plate and the second plate relative to each other. The term "clamp" may particularly denote that the carrier may be designed to have parts brought together for holding or compressing the electronic components. The parts which may be brought together are the first abutting section and the second abutting section.

The plate connecting elastic element and the plurality of elastic units may be adapted to provide a total force for a self-acting transition from an enlarged size of the receptacles in which the electronic components may be receivable in the receptacles towards a reduced clamping size of the receptacles in which the electronic components may be clamped. The total force may be defined by a force exerted by the at least one plate connecting elastic unit minus a force exerted by the plurality of elastic units when the electronic components come into clamping positions. The force of the at least one plate connecting elastic unit may be greater than the force exerted by the plurality of elastic units. The total force may be positive and may provide a self-acting transition from an enlarged size of the receptacles to a clamping size of the receptacles where the second plate abutting section of the first plate and the first plate abutting section of the second plate may abut on each other.

The carrier may further comprise handling structures formed at the first plate and at the second plate. The handling structures may be adapted for handling the first plate and the second plate to relatively move the slidably arranged first plate and second plate against a force of the plate connecting elastic element towards an enlarged size of the receptacles. The handling structures of the carrier may be adapted to relatively move the first plate and the second plate against the total force provided by the force of the at least one plate connecting elastic unit minus the force of the plurality of elastic units. The handling structures may be adapted to enlarge the receptacles against the total force to the enlarged size in which the bodies of the electronic components are receivable in the receptacles.

The carrier may be provided with a first plate, a second plate and a third plate, wherein the first plate comprises the elastic units and the second plate comprises the second abutting sections, wherein the first plate is arranged floatingly between the second plate and the third plate, and wherein the first plate is adapted to allow for a mutual relocation of the multiple first abutting sections relative to the multiple second abutting sections. The first plate may be adapted to allow for a mutual relocation (particularly floating) of the first abutting sections flexibly mounted via the elastic units. The carrier may comprise a third plate, wherein the first plate may be arranged floatingly between the second plate and the third plate, wherein the second plate and the third plate may be fixedly mounted to each other. The first plate may be the elastic unit plate and may be adapted to allow for a mutual floating (particularly connected or constructed so as to operate and adjust smoothly) of the first abutting sections. The term "float" may particularly denote a drift without a defined external control. In particular "float" may denote that the first plate may change its position relative to the second plate and the third plate with small or negligible friction forces. The handling structures may be adapted to move the first plate towards an enlarged size of the receptacles against the total force. The plate connecting elastic unit may be adapted to move the first plate towards the clamping size of the receptacles. The first plate, the second plate and the third plate may be arranged parallel to each other. The first plate may move along the second plate and the third plate between which the first plate may be arranged. The first plate may be secured against unwanted deformation in each direction which may be the direction towards the second plate and the direction towards the third plate. The second plate and the second plate may be planar or may have recesses adapted to guide the movement of the first plate.

The second plate may be the base support plate and may comprise the base support sections which may be adapted to support main surfaces of the electronic components. The base support sections of the receptacles may be formed from the second plate. The base support plate assigned to the respective receptacle may extend to a second plate integrally formed from one plate or made up of multiple base support plates. The orientation of the second plate may be parallel to each of the receptacles and may be parallel to each of the base support sections. The support force exerted by each of the base support sections may act perpendicularly on main planes of the electronic component and may be parallel to each other.

The third plate may be the receiving plate and may be adapted for delimiting at least partially a receiving opening of the receptacle. In particular, the third plate may be the receiving plate comprising receiving openings for supplying electronic components to the receptacles. The third plate may cover the first plate. Through the third plate the electronic components may be put into the receptacles of the carrier. The third plate may be integrally formed from one plate or may be made up of multiple receiving plates.

The first plate or the third plate may comprise one of the first abutting sections and the second abutting sections which are fixedly mounted. The first abutting sections and the second abutting sections may be formed from the first plate or the third plate. When the abutting section being fixedly mounted is formed from the first plate, which may particularly be denoted as elastic unit plate, this abutting section may be situated at the same height like the second abutting section. This may be advantageous for electronic components being extremely thin. When the abutting section being fixedly mounted is formed from the third plate the size of the receptacles may be varied by approaching the first abutting sections and the second abutting sections mutually or by pulling apart the first abutting sections and the second abutting sections.

In particular, the first plate or the third plate comprises the second abutting section being fixedly mounted.

In the following, further exemplary embodiments of the method will be described. However, these embodiments also apply to the align fixture and to the carrier.

The method may further comprise placing the electronic components in a post processing machine and subsequently subjecting the electronic components to an operation of the post-processing machine while the electronic components maintain in aligned positions in the receptacles of the carrier. A method of post-processing may particularly denote a process of evaluation or test of electronic components. Hence, a post-processing machine may particularly denote a machine for evaluating or testing of electronic components. During post-processing the electronic components may be subjected under various physical conditions to get information about the quality of the electronic components. Post-processing may particularly denote a quality test or a quality evaluation of the electronic component by subjecting the electronic components under the various electrical and/or mechanical conditions of interest.

The method may further comprise elastically clamping the electronic components by the clamping mechanism exclusively on side sections of the electronic components. The electronic components may be placed in enlarged receptacles of a carrier and thereupon may be elastically clamped and aligned by a clamping mechanism in a clamping size of the receptacles. The transition of the enlarged size of the receptacles to a clamping size of the receptacles may take place in a main plane of the receptacle. The main plane of the receptacle may match with a main plane of the carrier, with a main plane of the electronic component and with a main plane of the align fixture. The carrier may be put into a post-processing machine. While the electronic components are clamped and aligned in the receptacles the electronic components may be subjected to operations of the post-processing machine.

The method may further comprise providing the carrier with an identifying feature or an identifier for definite (particularly precise, unique or unambiguous) identification of the carrier. Post-processing machines may form an assembly line. The carriers may be transported from one post-processing machine to a further post-processing machine. A unique identification of each of the carriers in a plant during post-processing enables tracking (particularly tracing) the way of each of the carriers in the plant and enables tracking each of the electronic components. Thus, by the identifying feature each of the carriers and each of the electronic components may be tracked in an assembly line.

The method may further comprise providing the carrier with fiducial markers for fiducial detection. A vision system together with fiducial markers or marks may provide a detection of the position and orientation of the carrier in a post-processing machine. This may be advantageous when operating processes which need accurate alignment of the carrier such as for marking or contacting the electronic components.

The method may comprise aligning the electronic components with the second abutting sections, wherein the first force may be exerted in a self-acting manner by elastic (particularly flexible, resilient or springy) units (particularly a piece or complex of apparatus serving to perform one particular function) to which the first abutting sections are mounted. Each one of the first abutting sections may be mounted at least to an assigned one of the elastic units. The elastic units may each exert the first forces towards the second abutting sections. Each one of the second abutting sections is assigned to one of the first abutting sections. The electronic components may be aligned with the second abutting sections.

The method may further comprise exerting two force components on at least one of the first abutting sections and the second abutting sections so that this abutting sections exert two angled force components on the electronic components.

The post-processing may comprise laser marking while the electronic components are held and aligned by the carrier and are moved by handling the carrier. While the electronic components are clamped and aligned in the receptacles the electronic components may be subjected to a laser marking procedure. The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have access openings in their centres extending only so far that the edge regions of the electronic components still abut with the base support sections.

The post-processing may comprise a burn-in test while the electronic components are held and aligned by the carrier and are moved by handling the carrier. In a burn-in test the electronic components, especially semiconductor devices, may be subjected to heat for a predefined time interval (for instance temperatures of up to 200° C. for a fraction of an hour up to several hours). During the burn-in test the electronic components may be additionally subjected to a power test by a current feed and/or the electronic components may be subjected to an electronic test for testing the electronic quality of the electronic components. The carrier may be adapted to withstand high temperatures by forming the carrier of temperature resistant materials like metal, thermosetting plastics or resins.

The post-processing may comprise a bake-in process while the electronic components are held and aligned by the carrier and are moved by handling the carrier. The bake-in process may be a process where the electronic components are heated for a predefined time interval (for instance temperatures of up to 200° C. for a fraction of an hour up to several hours) without any electrical test or load. Forming the carrier from temperature resistant materials may enable the carrier to withstand bake-in processes, wherein the electronic components are subjected to high temperatures for a period of about one hour. The bake-in process may be used to reduce electrical load on the electronic components to further continue with a final test.

The post-processing may comprise a final test on a handler while the electronic components are held and aligned by the carrier and are moved by handling the carrier. The final test having a variety of embodiments may be a test being carried out before the electronic components are assembled. The final test of electronic components, e.g. semiconductor devices, may be an electronic functional test and may comprise a variety of physical test conditions, such as a variety of temperatures, pressures, accelerations and inclination angles in an arbitrary combination. Forming the carrier from a material or materials which withstand the mechanical and temperature strain the carrier may be adapted to align the electronic components under these variable conditions and may be adapted to allow for a contacting the contacts of the electronic components.

In an embodiment the post-processing does not comprise a final test on a handler while the electronic components are held and aligned by the carrier and are moved by handling the carrier. After laser marking, burn-in or bake-in directly a selective marking may be operated on the electronic components.

In particular, the post-processing is free of a final test on a handler while the electronic components are held and aligned by the carrier and are moved by handling the carrier.

The post-processing may comprise a selective marking while the electronic components are held and aligned by the carrier marking and are moved by handling the carrier. With reference to the explanation of the laser marking same is valid for selective marking, e.g. laser marking: The electronic components may have an accessible symbol side independent of whether the contact side abuts with the base support section or whether the symbol side abuts with the base support section. If the contact sides abut with the base support sections the symbol side lies open to the receiving side and may be subjected to laser marking without any restrictions. If the symbol sides abut with the base support sections the base support sections of the receptacles may have openings in their centres extending so far that the edge regions of the electronic components abut with the base support sections. After selective marking the electronic components placed in the carrier may be selectively marked "positive", selectively marked "negative" or may be completely marked either "positive" or "negative". Other classifications (different from "positive" or "negative") are possible as well. The selective marking may also comprise a mark pointing out a quality feature of the electronic components, e.g. a mark which signs the maximum frequency to operate a semiconductor device.

At least two of the group consisting of the laser marking, the burn-in test, the bake-in, the final test and the selective marking may be performed without removing the electronic components from the carrier. In other words, multiple of these or other procedures may be carried out while the electronic component remains aligned in the carrier. The carrier may be adapted to withstand a variety of physical conditions and may accurately align the electronic component through complete or partial post-processing. Thus, the electronic components may be held and aligned in the carrier during the complete post-processing or parts of post-processing.

After the post-processing the electronic components may be removed from the post-processing machine by removing the carrier from the post-processing machine while the electronic components are held and aligned by the carrier.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF EXEMPLARY EMBODIMENTS

Figure 1:
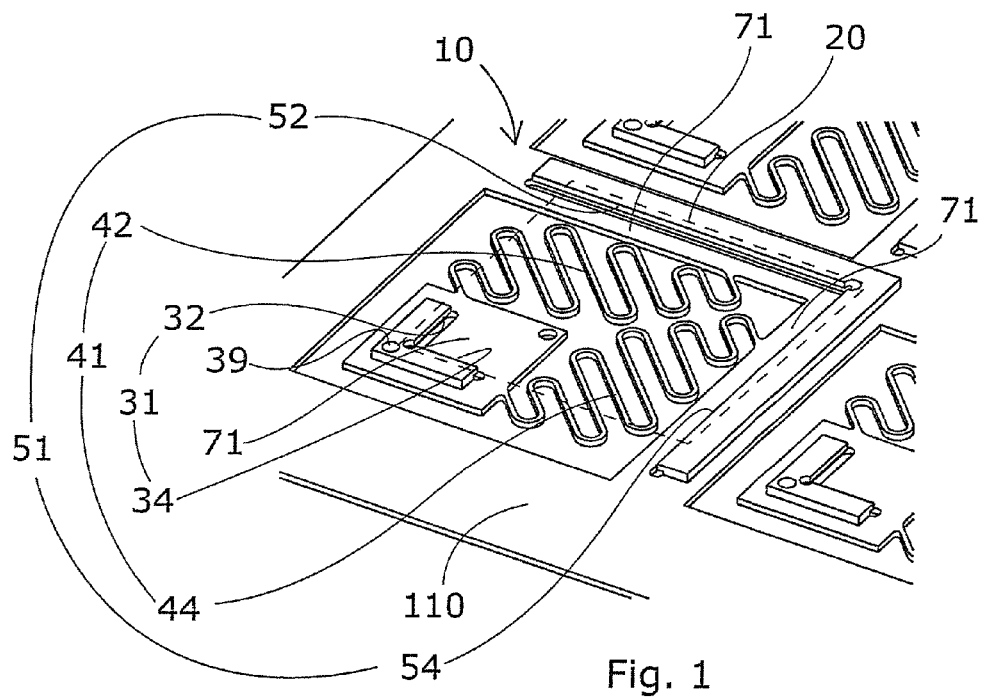
FIG. 1 shows a detailed view of and FIG. 2 shows an overview of a carrier according to an exemplary embodiment of the invention.

The illustration in the drawing is schematically. In different drawings, similar or identical elements are provided with the same reference signs.

Figure 2:
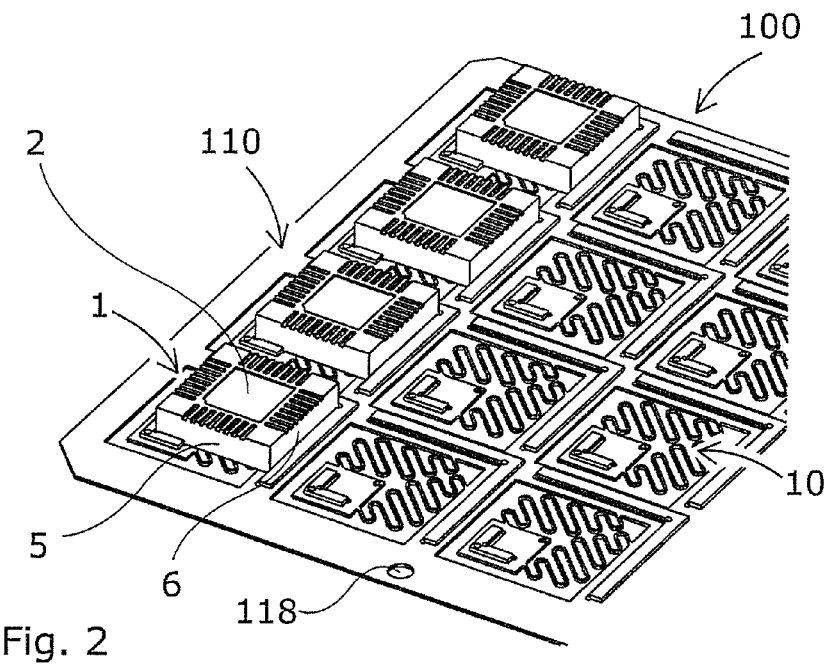

FIG. 1 shows a detail of a spring plate 110 of an align fixture 10 according to an exemplary embodiment of the invention, the spring plate 110 comprising elastic unit 41. The align fixture 10 shown in FIG. 1 forms part of a carrier 100 according to an exemplary embodiment of the invention. A larger part of this carrier 100 is shown in FIG. 2.

Again referring to FIG. 1, the detail shown here is located in a corner region of the carrier 100. The size of the detail shown in FIG. 1 basically corresponds to the align fixture 10. A receptacle 20 (illustrated schematically with dashed lines) may comprise or may be defined by a first part 32 of a first abutting section 31, a second part 34 of the first abutting section 31, a first part 52 of a second abutting section 51, a second part 54 of the second abutting section 51 and a base support section 71. The base support section 71 extends at a bottom side of the receptacle 20. The first abutting section 31 is formed by the first part 32 and the second part 34 which first part 32 and second part 34 are angled to each other by 90°, and the first abutting section 31 is a stiff member. The second abutting section 51 is formed by the first part 52 and the second part 54 which first part 52 and second part 54 are angled to each other by 90°, and the second abutting section 51 is a stiff member. The first abutting section 31 and the second abutting section 51 extend or protrude vertically from the spring plate 110 upwards to be adapted to abut on side sections of electronic component 1 (see FIG. 2) such as a packaged electronic chip. The base support section 71 has a section near the first abutting section 31 and a section near the second abutting section 51. A first abutting section actuation hole 39 is adapted to be actuated by a pin (not shown) or the like to bring the elastic unit 41 in a prestressed or biased position.

The elastic unit 41 comprises a first spring element 42 and a second spring element 44 wherein each of the first spring element 42 and the second spring element 44 extend from the first abutting section 31 towards the second abutting section 51 and is aligned along its entire extension at the bottom side of the receptacle 20, i.e. below the electronic component 1 when being received in the receptacle. The arrangement of the elastic unit 41 shown in FIG. 1 allows for a space-saving design of the align fixture 10.

The first spring element 42 and the second spring element 44 extend beside each other forming the elastic unit 41. The first spring element 42 and the second spring element 44 are mirror-symmetrical. The first abutting section 31 has an L-shape which extends upwards from a plate which forms at least partially the base support section 71. The first spring element 42 and the second spring element 44 are stiff perpendicular to the main plane of the receptacle 20 and are flexible parallel to the main plane of the receptacle 20. The first spring element 42 and the second spring element 44 are arranged below and in a view from above in the space between the receptacle 20.

The first spring element 42 and the second spring element 44 are each planar and of a meandrical shape. With one of its end each of the first spring element 42 and the second spring element 44 is fixedly mounted to the first abutting section and with the other of its end each of the first spring element 42 and the second spring element 44 is fixedly mounted to the second abutting section. The first spring element 42, the second spring element 44 and the base support plate are integrally formed from one plate.

FIG. 2 shows a detail of a carrier 100 comprising the spring plate 110 with several align fixtures 10. The spring plate 110 comprises the align fixtures 10. In each of four align fixtures 10 one electronic component 1 is placed. The electronic components 1 are placed upside down in the receptacle 10, so that a contact side 2 and a first side section 5 and a second side section 6 can be seen directly. A fiducial element 118, such as a hole, may be located at one side section of the spring plate 110.

Figure 3:
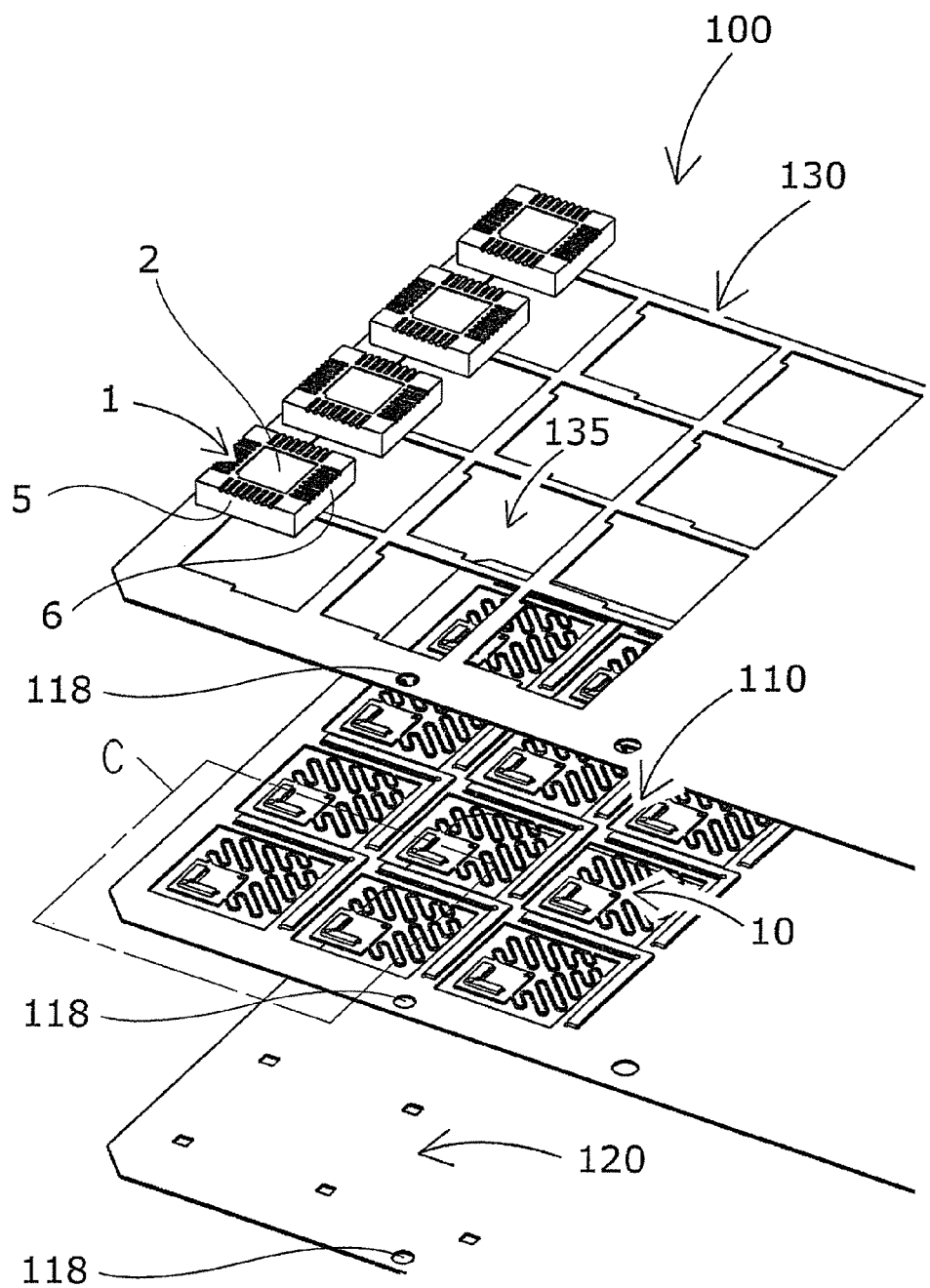
FIG. 3 shows an exploded view of a carrier according to an exemplary embodiment of the invention.

FIG. 3 shows an exploded view of a detail of the carrier 100. The carrier 100 comprises the spring plate 110 which may carry the receptacles 20 and which may be denoted as elastic unit plate. The carrier 100 additionally comprises a second plate 120 which may be denoted as base support plate and a third plate 130 which may be denoted as receiving plate. The receiving plate 130 may comprise receiving openings 135 through which the electronic component 1 is to be received in the receptacles 20 of the align fixture 10. In this view twelve receiving openings 135 can be seen. However, the carrier 100 may comprise an arbitrary number of receiving openings 135 and a corresponding number of align fixtures 10 and receptacles 20. The electronic components 1 are depicted upside down so that a contact side 2 and a first side section 5 and a second side section 6 can be seen directly. The fiducial element 118 may be located on a side section of each plate, the spring plate 110, the second plate 120 and the third plate 130.

Figure 4:
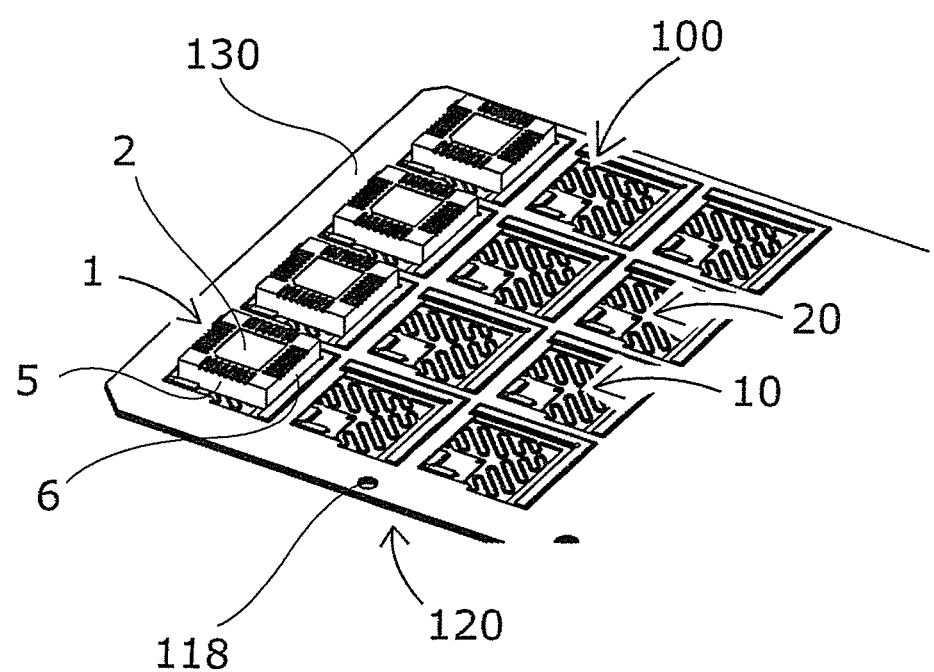
FIG. 4 shows an overview of an assembled carrier according to an exemplary embodiment of the invention having four electronic components mounted thereon.

FIG. 4 shows a view of a detail of a carrier 100 which may comprise the spring plate 110, the second plate 120 and the third plate 130. Since the third plate 130 covers the spring plate 110 and the second plate 120 only the receptacles 20 of the align fixture 10 may be seen. Again the electronic components 1 are depicted upside down so that a contact side 2 and a first side section 5 and a second side section 6 can be seen directly.

Figure 5:
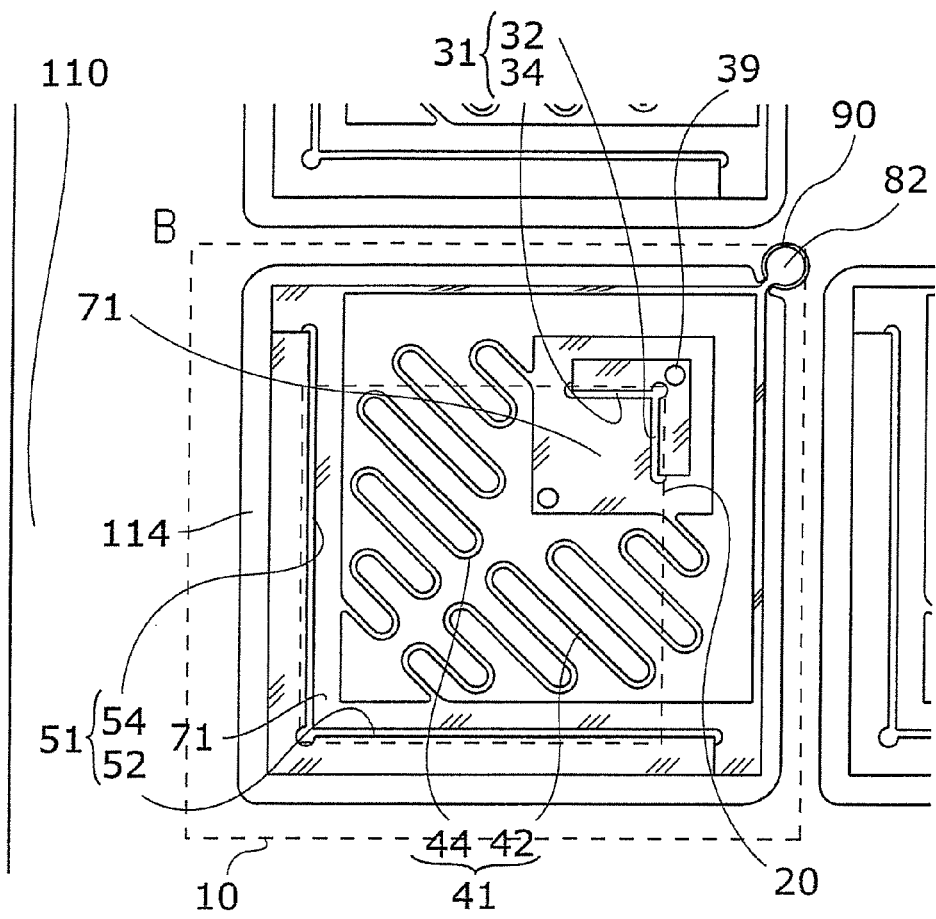
FIG. 5 shows a detailed view of and FIG. 6 shows an overview of a carrier according to an exemplary embodiment of the invention.

FIG. 5 shows a view from above of a detail of the spring plate 110 depicting a receptacle 20 which may be a separate member and may be clipped to and thereby fastened at the spring plate 110. The spring plate 110 may comprise an elastic unit receiving opening 114 and an elastic unit receiving section 90 (which may also be denoted as an elastic unit fastening section). The elastic unit receiving opening 114 is adapted to receive the complete receptacle 20 of the corresponding align fixture 10. The elastic unit receiving section 90 is adapted to engage with an elastic unit fixing 82 (for instance a pin) in a form locking manner. The second abutting section 51 and the elastic unit fixing 82 together form a stiff member. Thus, the second abutting section 51 is fixedly mounted to the spring plate 110. The first abutting section 31 is flexibly mounted at the second abutting section 51 via the elastic unit 41. In its main function the embodiment of the receptacle 20 is similar to the embodiment shown and discussed in FIG. 1.

Figure 6:
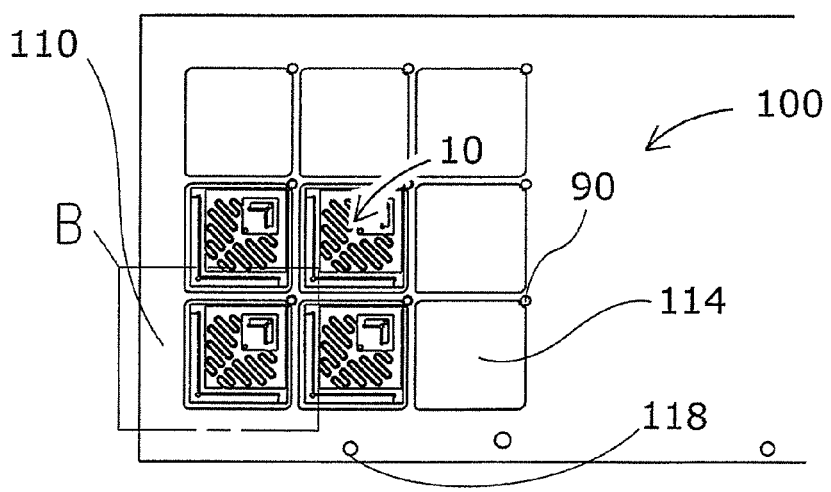

FIG. 6 shows a view from above of a detail of the carrier 100 including the detail shown in FIG. 5. The elastic unit plate 110 comprises nine elastic unit receiving openings 114 with nine corresponding elastic unit receiving sections 90. Four align fixtures 10 are provided with four corresponding receptacles 20. The fiducial element 118 may be located at one side section of the spring plate 110.

Figure 7:
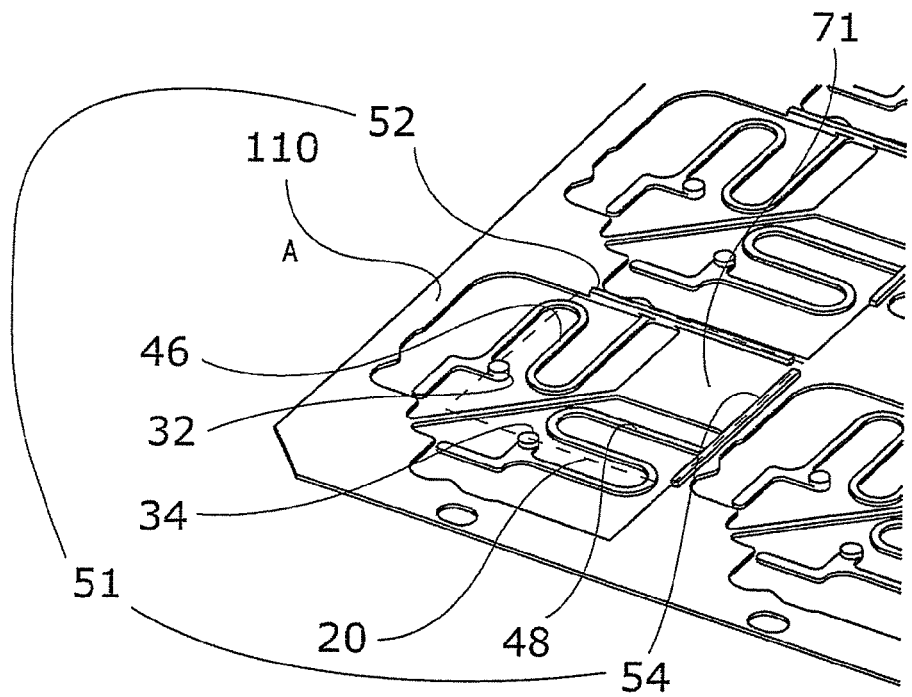
FIG. 7 shows a detailed view of and FIG. 8 an exploded view of a carrier according to an exemplary embodiment of the invention.

FIG. 7 shows a view from above of a detail of a carrier according to another exemplary embodiment of the invention comprising a first elastic unit 46 and a second elastic unit 48 adapted to engage two angled side sections of the electronic component 1. The first elastic unit 46 and the second elastic unit 48 are arranged in a mirror-symmetrical manner. The second elastic unit 48 has an S-shape and a first meander is located under the receptacle 20. The second meander of the second elastic unit 48 is located beside the receptacle 20. The carrier in this embodiment may only comprise an elastic unit plate 110, i.e. plates 120 and 130 are omitted here. The receptacle 20 may be formed by the first abutting section 32 flexibly mounted via the first elastic unit 46, the second abutting section 51 formed by a first part 52 and a second part 54, the third abutting section 34 mounted via the further elastic unit 48, and a base support section 71 forming the support for one of the main surfaces of the electronic component 1. Thus, there may be five of six sides of the electronic component 1 abutting on sections of the receptacle 20.

Figure 8:
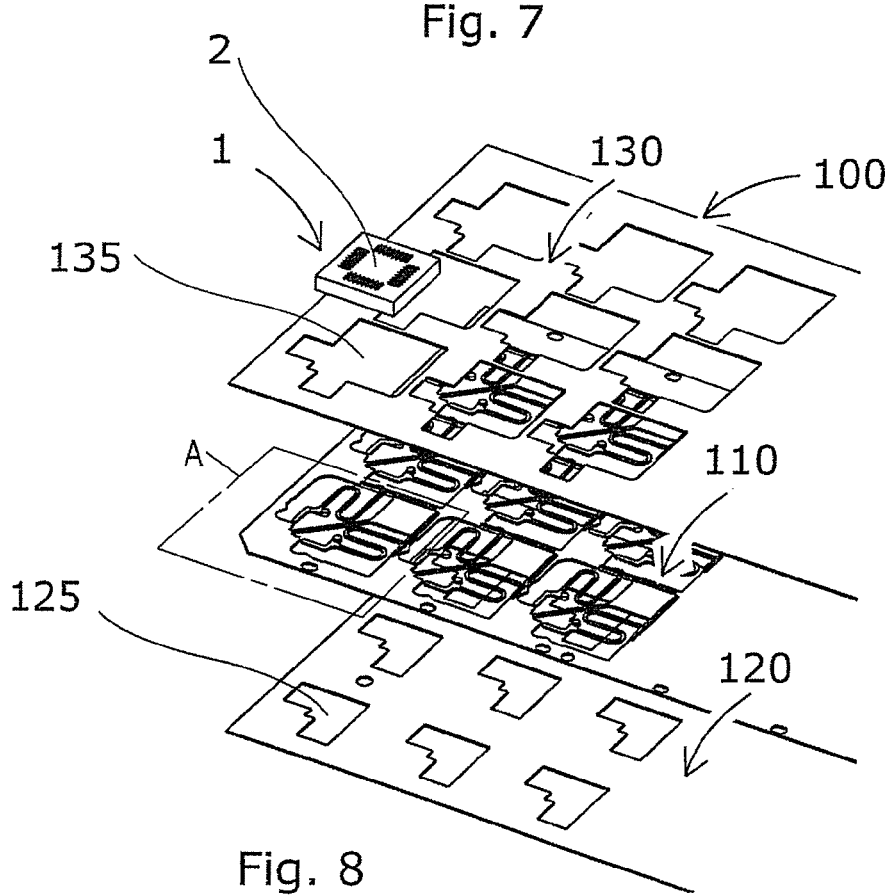

FIG. 8 shows an exploded view of the carrier 100 referring to the detail depicted in FIG. 7. The carrier 100 may comprise a spring plate 110 comprising the elastic unit 46 and the further elastic unit 48 (shown in FIG. 7). The second plate 120 which may denote the base support plate 120 may have access openings 125 for instance to enable laser marking of the electronic component 1 being placed in the receptacle 20 upside down so that the contact side 2 of the electronic component 1 is visible. The electronic component 1 may be placed through receiving openings 135 of the receiving plate 130 on the receptacle 20.

Figure 9:
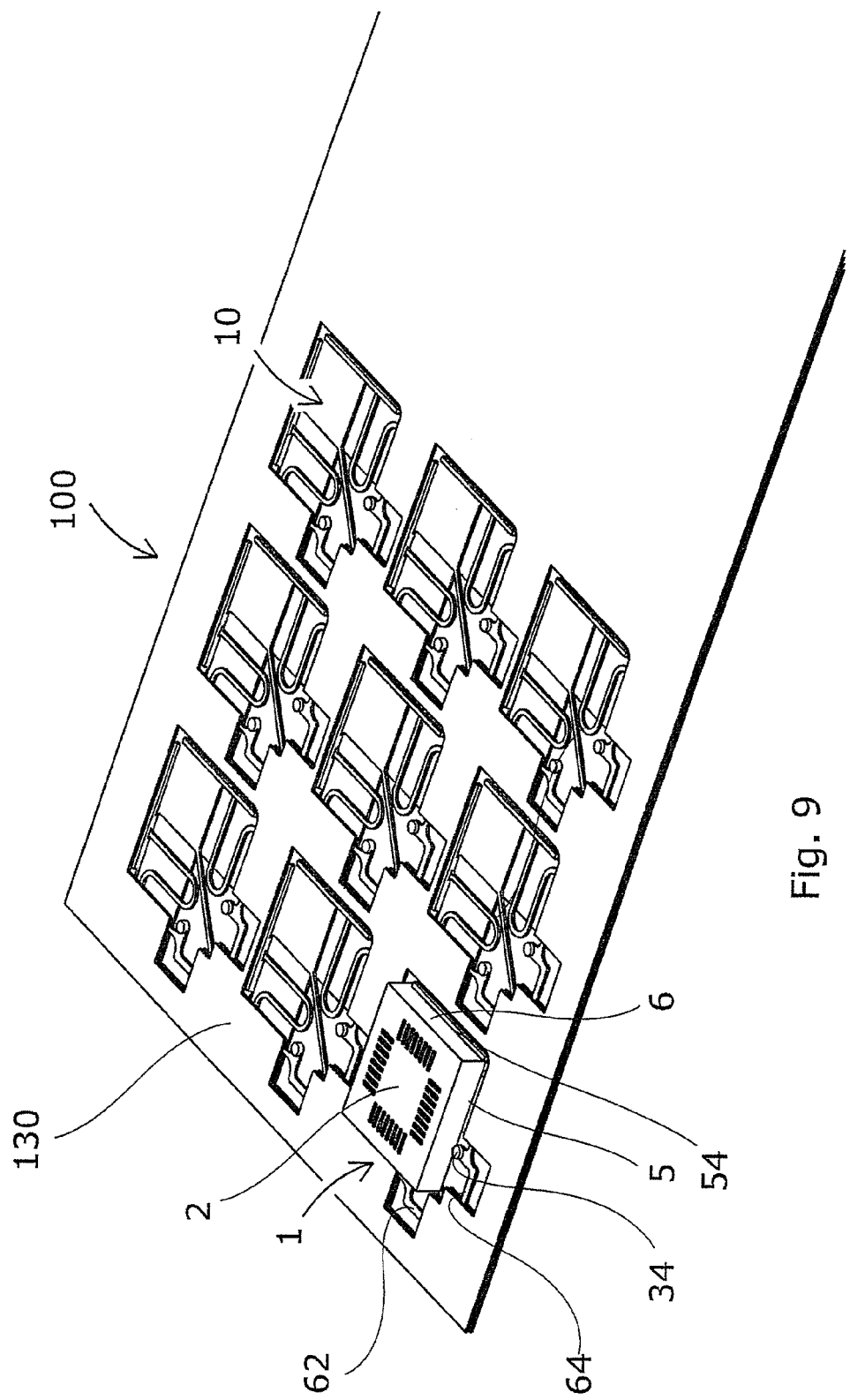
FIG. 9 shows an overview of an assembled carrier according to an exemplary embodiment of the invention having an electronic component mounted thereon.

FIG. 9 shows an assembled view from above of carrier 100 wherein the spring plate 110, the base support plate 120 and the receiving plate 130 are assembled together. Since the receiving plate 130 covers the spring plate 110 and the base support plate 120 nearly completely the receiving plate 130 can be recognized. The depiction shows nine align fixtures 10 and one align fixture with an electronic component 1 received in one receptacle 20. Additionally visible is third abutting section 34 abutting on the first side section 5 of the electronic component 1. The electronic component 1 abuts with its second side section 6 on the first part 54 of the second abutting section 51 of the receptacle 20. An actuation section 64 is accessible to be actuated for removing of the third abutting section 34 from the first side section 5 of the electronic component in order to enlarge the size of the receptacle 20. Angled to the actuation section 64 a further actuation section 62 may abut on another side section of the electronic component 1. The actuation section 62 and the actuation section 64 are each accessible for being actuated for enlarging the size of the receptacle 20.

Figure 10:
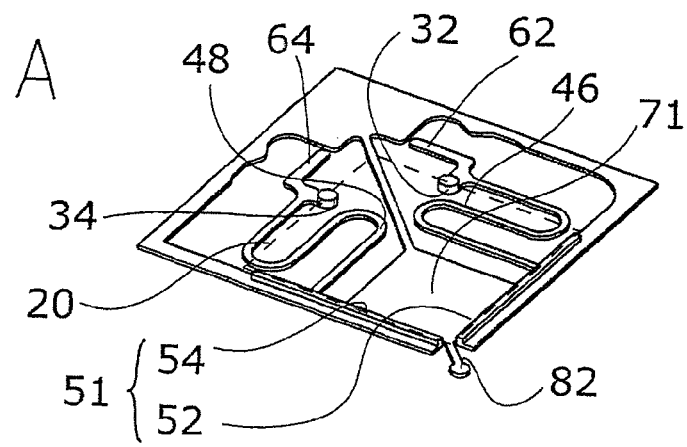
FIG. 10 shows a detailed view of and FIG. 11 an exploded view of a carrier according to an exemplary embodiment of the invention.
Figure 11:
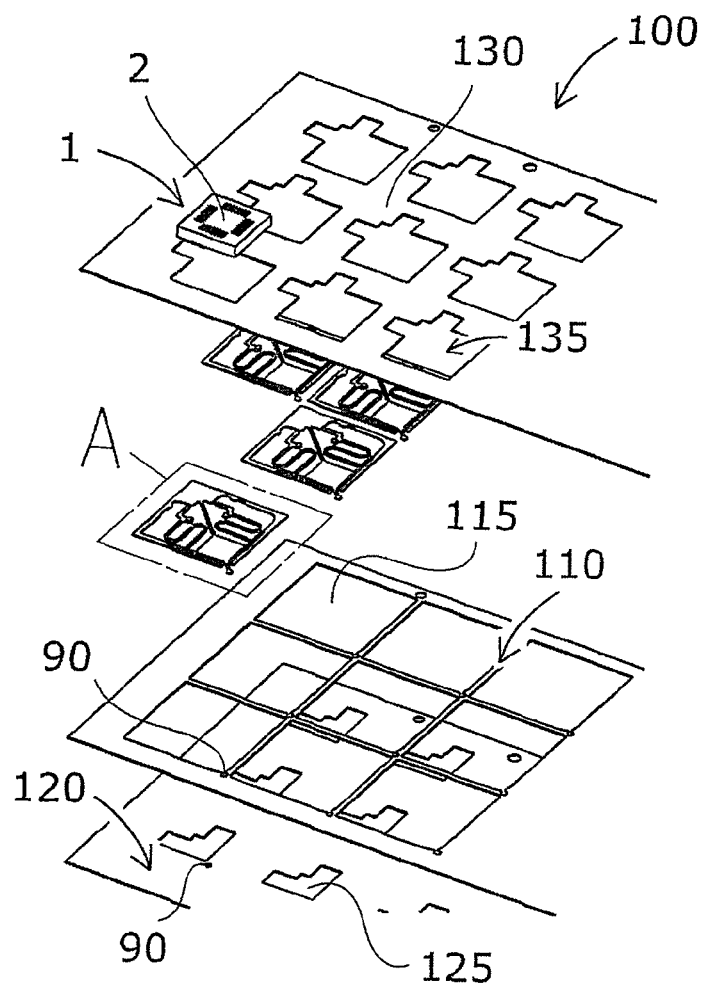

FIG. 10 shows a view of a separate elastic member comprising the receptacle 20 and FIG. 11 shows an according carrier 100 in an exploded view. The receptacle 20 of embodiment of FIG. 10 is very similar to the receptacle 20 of embodiment of FIG. 7. Since the separate elastic member has a fixing 82 the separate elastic member may be clipped onto the spring plate 110, shown in FIG. 11, more precisely can be fastened to spring plate 110 by engaging fixing 82 in recess 90. The spring plate 110 may comprise an elastic unit receiving opening 115 and an elastic unit receiving section 90. The elastic unit receiving opening 115 is adapted to receive the complete receptacle 20 of the corresponding align fixture 10. The elastic unit receiving section 90 is adapted to engage with an elastic unit fixing 82 in a form locking manner (for instance by a snap-fit connection, a clip connection, etc.). The second abutting section 51 and the elastic unit fixing 82 together form a stiff member. Thus, the second abutting section 51 is fixedly mounted to the spring plate 110. The first abutting section 32 is flexibly mounted via the first elastic unit 46 and the third abutting section 34 is flexibly mounted via the second elastic unit 48. The first elastic unit 46 has a first actuation arm 64 which is adapted to be actuated by a pin (not shown) or the like to bring the first elastic unit 46 in a prestressed or biased position. The second elastic unit 48 has an second actuation arm 62 which is adapted to be actuated by a pin (not shown) or the like to bring the second elastic unit 48 in a prestressed or biased position.

FIG. 11 is the exploded view of the carrier 100 depicted in FIG. 9 and comprising the separate elastic member according to FIG. 10. The carrier 100 may comprise a first plate 110 which may carry the receptacles 20 and which may be denoted as elastic unit plate. The carrier 100 may additionally comprise a second plate 120 which may be denoted as base support plate and a third plate 130 which may be denoted as receiving plate. The receiving plate 130 may comprise receiving openings 135 through which the electronic component 1 is to be received in the receptacles 20 of the align fixture 10. In this view nine receiving openings 135 can be seen. However, the carrier 100 may comprise an arbitrary number of receiving openings 135 and a corresponding number of align fixtures 10 and receptacles 20. The electronic components 1 are depicted upside down so that the contact side. The separate elastic member A may be fixedly inserted by the elastic unit receiving section 90 to the elastic unit receiving opening 115 of the spring plate 110.

Figure 12:
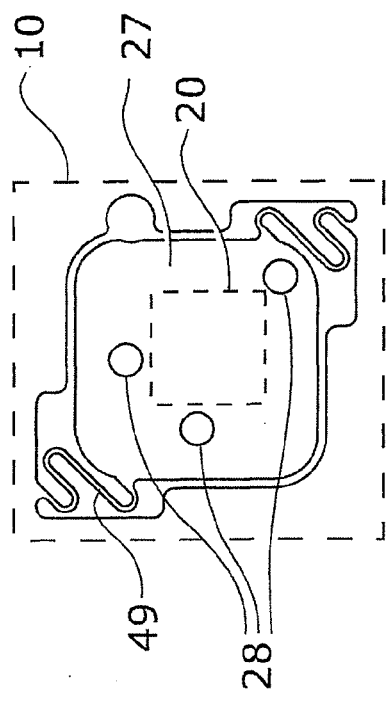
FIG. 12 shows a detailed view of and FIG. 13 an exploded view of a carrier according to an exemplary embodiment of the invention.

FIG. 12 shows an align fixture 10 comprising a floatable mounted receptacle 20. A floatable mounted frame 27 is floatably mounted via two opposing elastic units 49. Two elastic units 49 are S-shaped and extend from outer sections to the hereby floatable mounted frame. Thus, the receptacle 20 integrated in the floatable mounted frame 27 is also floatable. Adjustment units 28 arranged on the floatable mounted frame 27 allow for a fine adjustment of the floatable mounted frame 27 and hence for fine adjustment of the receptacle 20. Three adjustment units 28 may allow for a fine adjustment of the receptacle in the main plane of the align fixture 10.

Figure 13:
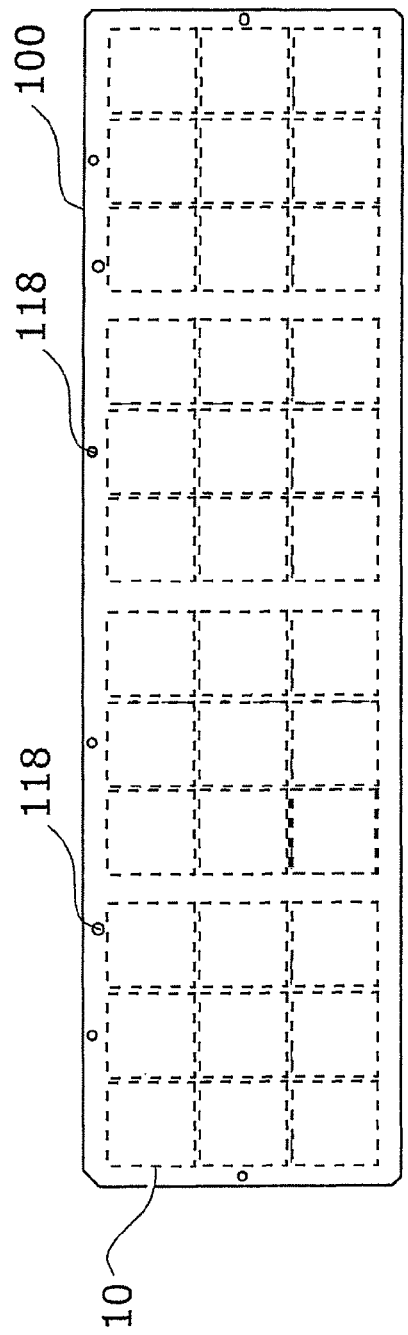

FIG. 13 shows a schematic view from above of a complete carrier 100 having thirty-six align fixtures arranged in a matrix form of 4×9 align fixtures. Two fiducial elements 118 arranged in the edge region of the carrier 100 may be used to align the carrier 100.

FIG. 14

Figure 14:
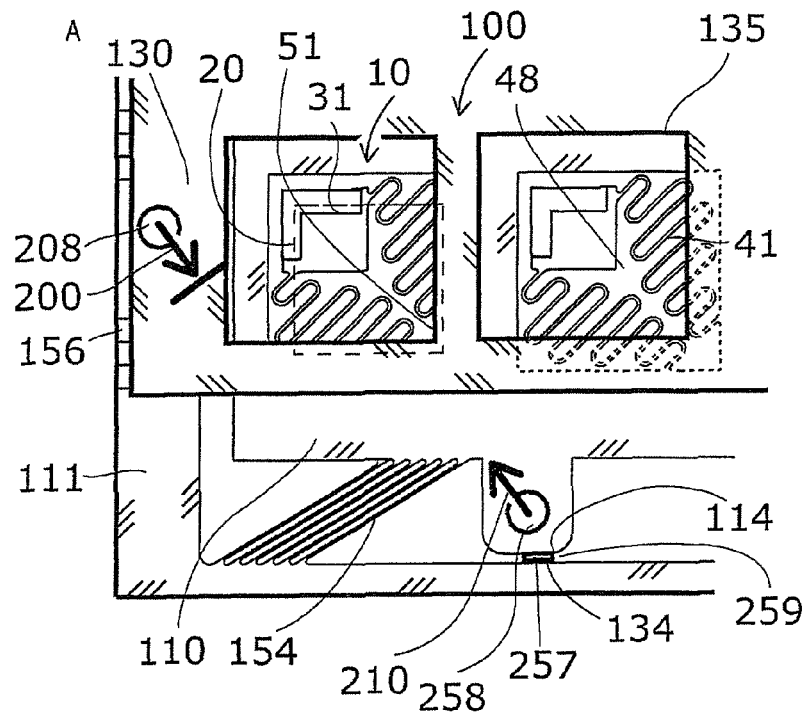
FIG. 14 and FIG. 15 show a detailed view of a carrier according to an exemplary embodiment of the invention in different operation states.
Figure 15:
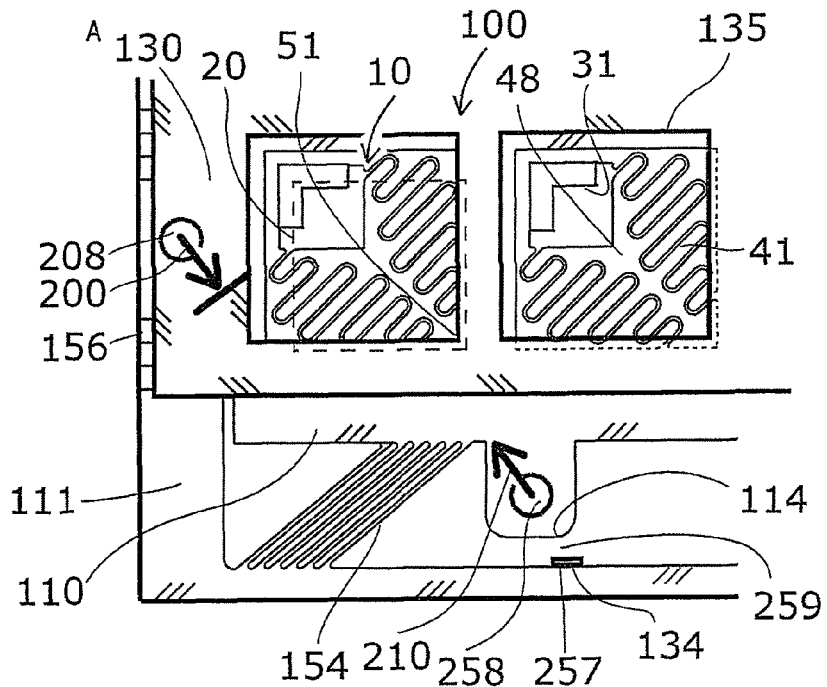

FIG. 14 and FIG. 15 show a view from above of a detail of the carrier 100, wherein the carrier 100 comprises a slidably mounted spring plate 110 elastically coupled to an elastic unit plate frame 111 via a plate connecting elastic unit 154. The elastic unit plate frame 111 is fixedly mounted at the receiving plate 130. Thus, by bending the plate connecting elastic unit 154 the spring plate 110 may slide relative to the receiving plate 130 having receiving openings 135 which form the second abutting sections 51. The first abutting sections 31 mounted at the spring plate 110 via the elastic units 41 may slide relative to the second abutting section 51 forming a fixed part of the receiving plate 130. A receptacle opening 48 of the receptacle 20 formed by the first abutting section 31 and the second abutting section 51 may be enlarged by sliding the spring plate 110 relative to the receiving plate 130. By engaging elastic unit actuation hole 258 with actuation force 210 the spring plate 110 may be slid relative to the receiving plate 130 and the elastic unit plate frame 111 since the receiving plate 130 and the elastic unit plate frame 111 may be fixed at fixing hole 208. An opposing force 200 may be applied in order to fix the carrier 100 against the force of the actuation force 210. At several fixing points 156 the receiving plate 130 and the elastic unit plate frame 111 may be fixedly coupled to each other.

Referring to FIG. 14 a first plate abutting section 134 of the second plate 130 which may be denoted as receiving plate 130 and a second plate abutting section 114 of the spring plate 110 abut with each other. A spacer 257 may be adapted to regulate the size of the receptacle opening 48. When the first plate abutting section 134 and the second plate abutting section 114 abut with each other the clamping size of the receptacle formed by the first abutting section 31 and the second abutting section 51 may be reached. The size of the receptacle opening 48 may be smaller than the electronic component 1 to be received, so that the electronic component 1 may be clamped by the first abutting section 31 and the second abutting section 51. The space 259 between the spring plate 110 and the elastic unit plate frame 111 may have the size of the spacer 257.

Referring to FIG. 15 a receiving size of the receptacle opening 48 is shown. The space 259 between the spring plate 110 and the elastic unit plate frame 111 is enlarged. Therefore, also the size of the receptacle opening 48 may be enlarged to a size where the electronic component 1 may be received in the receptacle 20, i.e. in the space between the first abutting section 31 and the second abutting section 51.

It should be noted that the term "comprising" does not exclude other elements or steps and the "a" or "an" does not exclude a plurality. Also elements described in association with different embodiments may be combined. It should also be noted that reference signs in the claims shall not be construed as limiting the scope of the claims. Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. An align fixture for aligning an electronic component, the align fixture comprising:
   a receptacle adapted to receive the electronic component and comprising a first abutting section and a second abutting section, the first abutting section being flexibly mounted via an elastic unit to two neighboring sides of the align fixture, and the second abutting fixture fixedly mountable to the two neighboring sides of the align fixture, wherein the second abutting section is a stiff member;
   wherein the elastic unit extends from the first abutting section to the second abutting section;
   wherein the elastic unit comprises a spring element, wherein one end of the spring element is fixedly mounted to the first abutting section and another one end of the spring element is mounted to the second abutting section,
   the first abutting section and the second abutting section delimit an electronic component receiving volume in which the electronic component is to be received in the receptacle;
   wherein the elastic unit is adapted to provide a clamping force for clamping the electronic component between the first abutting section and the second abutting section by bringing together the first abutting section and the second abutting section to abut on side sections of the electronic component;

wherein the elastic unit extends below a bottom side of the electronic component receiving volume; and wherein the first abutting section extends upwardly from the elastic unit to which it is mounted, and the first abutting section extends aside of the electronic component receiving volume.

2. The align fixture according to claim 1, wherein the first abutting section is adapted to exert a first force and the second abutting section is adapted to exert a second force on the electronic component, and wherein the first force and the second force are at least partially opposed to one another.

3. The align fixture according to claim 1, wherein the first abutting section and the second abutting section are adapted so that a first force is exerted parallel to a main plane of the receptacle and a second force is exerted parallel to the main plane of the receptacle.

4. The align fixture according to claim 1, wherein the receptacle further comprises a base support section which forms a support surface parallel to a main plane of the receptacle and delimits a bottom side of the electronic component receiving volume.

5. The align fixture according to claim 1, wherein a base support section is adapted to exert a support force on the electronic component perpendicularly to the first force and perpendicularly to the second force.

6. The align fixture according to claim 1, wherein the flexibly mounted first abutting section is adapted to perform a movement parallel to a main plane of the receptacle.

7. The align fixture according to claim 1, further comprising:
a base support plate arranged below the elastic unit, wherein the elastic unit is adapted to perform a movement parallel to a main plane of the receptacle at least partially supported by the base support plate.

8. The align fixture according to claim 1, further comprising:
a base support plate and a receiving plate between which the elastic unit is arranged, and wherein the elastic unit is adapted to perform a movement parallel to a main plane of the receptacle at least partially guided by the base support plate and the receiving plate.

9. The align fixture according to claim 1, further comprising:
at least one thickness adjusting plate adapted for adjusting a thickness of the align fixture.

10. The align fixture according to claim 1, wherein the elastic unit comprises a first spring element and a second spring element, and wherein the first abutting section being flexibly mounted is connected with the first spring element and with the second spring element.

11. The align fixture according to claim 1, wherein the elastic unit is a separate elastic member adapted to be mounted at an elastic unit receiving section of the align fixture.

12. The align fixture according to claim 1, wherein an elastic unit receiving section is adapted to fix the elastic unit at a suspension of an elastic unit so that the elastic unit is fixed against rotation.

* * * * *